(12) United States Patent
Biber et al.

(10) Patent No.: US 10,345,359 B2
(45) Date of Patent: Jul. 9, 2019

(54) ARC DETECTOR AND A METHOD FOR DETECTING ARCS

(71) Applicant: APPLIED MATERIALS ISRAEL LTD., Rehovot (IL)

(72) Inventors: Tuvia Biber, Rishon-Lezion (IL); Efim Kerner, Rehovot (IL); Efraim Siman Tov, Rehovot (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 132 days.

(21) Appl. No.: 15/446,745

(22) Filed: Mar. 1, 2017

(65) Prior Publication Data

US 2017/0254847 A1    Sep. 7, 2017

Related U.S. Application Data

(60) Provisional application No. 62/302,622, filed on Mar. 2, 2016.

(51) Int. Cl.
*G01R 31/02* (2006.01)
*H03H 3/00* (2006.01)

(52) U.S. Cl.
CPC ......... *G01R 31/027* (2013.01); *G01R 31/025* (2013.01)

(58) Field of Classification Search
CPC .... G01R 31/02; G01R 31/025; G01R 31/027; H02H 3/00
See application file for complete search history.

(56) References Cited

U.S. PATENT DOCUMENTS

| | | | |
|---|---|---|---|
| 8,599,523 B1 * | 12/2013 | Ostrovsky ............ | G01R 31/025 361/45 |
| 2004/0095695 A1 * | 5/2004 | Kim ..................... | H02H 1/0015 361/42 |
| 2007/0153436 A1 * | 7/2007 | Pellon ................ | G01R 31/1272 361/42 |
| 2014/0195177 A1 * | 7/2014 | Kang ..................... | H02S 50/10 702/58 |

\* cited by examiner

*Primary Examiner* — Neel D Shah
(74) *Attorney, Agent, or Firm* — Kilpatrick Townsend & Stockton LLP

(57) ABSTRACT

A system comprising: a first high voltage unit that is coupled via a high voltage supply cable to a second high voltage unit; a transformer that is configured to magnetically couple the high voltage supply cable to windings of a transformer; and a detection unit that is configured to monitor a windings signal developed in the windings of the transformer to detect a first high voltage unit arc formed within the first high voltage unit and to detect a second high voltage unit arc formed within the second high voltage unit.

14 Claims, 9 Drawing Sheets

ARC DETECTOR AND A METHOD FOR DETECTING ARCS

CROSS-REFERENCES TO RELATED APPLICATIONS

This application claims the benefit of U.S. Provisional Application No. 62/302,622, filed on Mar. 2, 2016. The disclosure of which is hereby incorporated by reference in its entirety for all purposes.

BACKGROUND

The semiconductor industry constantly aims to increase the performances of semiconductor device while reducing the cost of semiconductor devices. Modern semiconductor devices include three dimensional transistors, three dimensional memory arrays and well as other smaller and/or denser semiconductor devices.

These modern semiconductor devices require a high resolution and high throughput inspection tools and review tools.

SUMMARY

According to an embodiment of the disclosure, a high resolution and high throughput inspection and review system is provided.

BRIEF DESCRIPTION OF THE DRAWINGS

The subject matter regarded as the disclosure is particularly pointed out and distinctly claimed in the concluding portion of the specification. The disclosure, however, both as to organization and method of operation, together with objects, features, and advantages thereof, may best be understood by reference to the following detailed description when read with the accompanying drawings in which:

Figure 1:
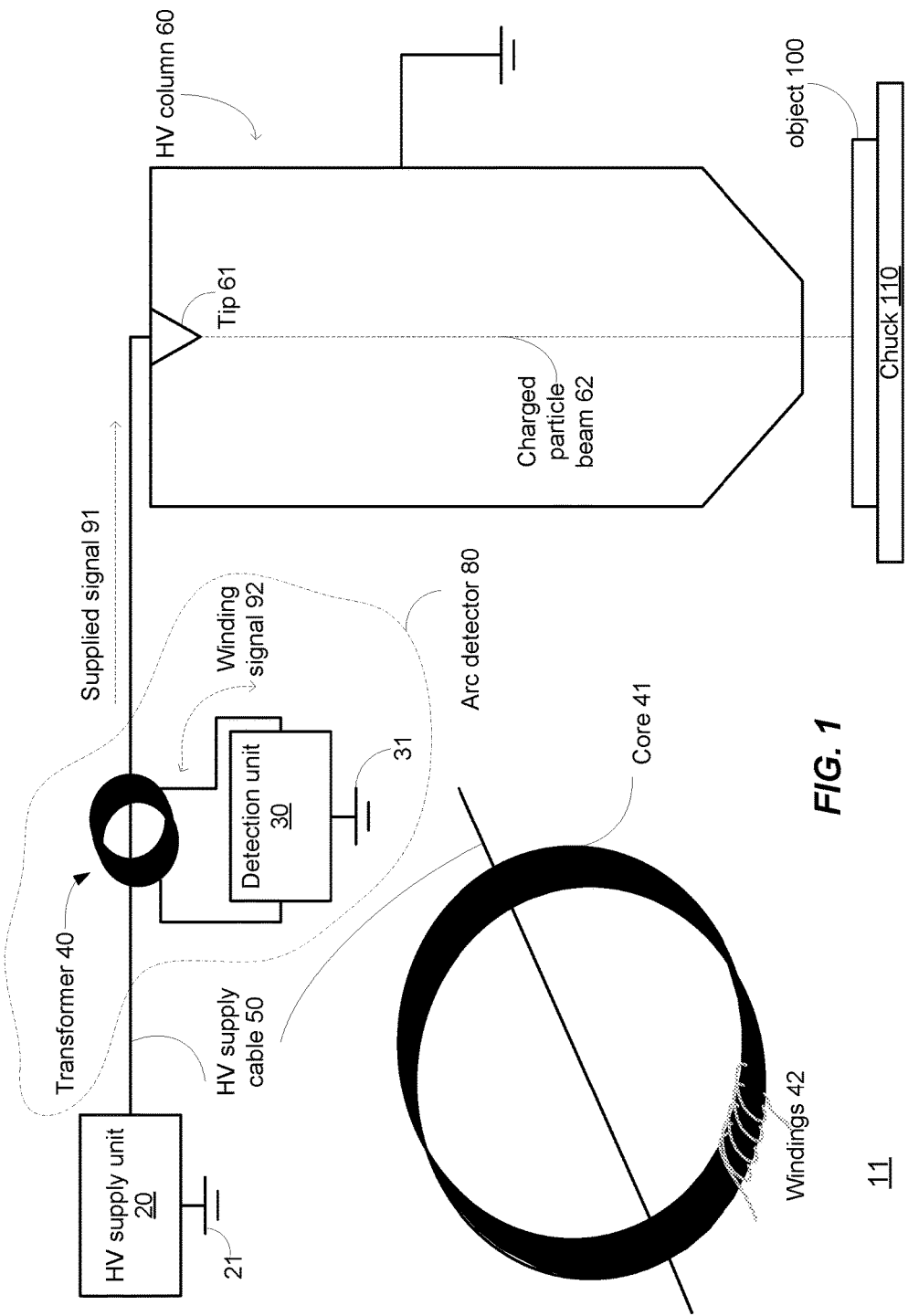
FIG. 1 illustrates a system and an object according to an embodiment of the disclosure.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the disclosure. However, it will be understood by those skilled in the art that the present disclosure may be practiced without these specific details. In other instances, well-known methods, procedures, and components have not been described in detail so as not to obscure the present disclosure.

The subject matter regarded as the disclosure is particularly pointed out and distinctly claimed in the concluding portion of the specification. The disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present disclosure may for the most part, be implemented using electronic components and circuits known to those skilled in the art, details will not be explained in any greater extent than that considered necessary as illustrated above, for the understanding and appreciation of the underlying concepts of the present disclosure and in order not to obfuscate or distract from the teachings of the present disclosure.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The term "high voltage" (HV), as used herein, refers to voltages that may exceed at least one out of 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, or 30000 volts.

FIG. 1 illustrates system 11 and object 100 according to an embodiment of the disclosure. Object 100 may be a semiconductor wafer, a solar panel, a micro electro mechanical system (MEMS), a nano electro mechanical system (NEMS), and the like. System 11 may illuminate object 100 by a charged particle beam 62 during a process selected out of a manufacturing process, a repair process, an inspection process and a review process.

The charged particle beam may be generated by HV column 60. HV column 60 may be fed by HV supplied signals. HV column 60 includes tip 61 for generating the charged particle beam. HV column 60 may include multiple electrodes (not shown). One of more of the multiple electrodes may be fed by high voltage signals. HV supply unit 20 of system 11 feeds HV column 60 with a supplied signal 91 (such as HV supply voltage) via HV supply cable 50.

Transformer 40 of system 11 is configured to magnetically couple the HV supply cable 50 to the windings of the transformer 40 and thus any signal that flow through HV supply cable 50 results (due to the magnetic coupling) in a windings signal 92 that flows through the windings of the transformer 40.

In FIG. 1 the transformer 40 is illustrated as including windings 42 that are wounded over toroidal core 41. The toroidal core 41 surrounds the HV supply cable 50. The toroidal core 41 may be of any shape (for example may have a rectangular cross section) and may or may not contact HV supply cable 50.

Detection unit 30 of system 11 is configured to monitor the windings signal 92 in order to detect (I) column arc formed within the HV column 60 and (II) supply unit arc formed within the HV supply unit 20. The detection unit 30 may be shielded in order to reduce electromagnetic interferences from the transformer 40. The detection unit 30 is grounded via first grounding circuit 31. The HV supply unit 20 is grounded via second grounding circuit 21. Using separate grounding circuits increases the immunity of the detection unit 30 to noises generated by the HV supply unit 20.

Detection unit 30 may be configured to detect an occurrence of an arc very quickly—within few nanoseconds. The fast detection may be attributed to the magnetic coupling of the HV supply voltage to the windings of the transformer and to the very fast analysis of the windings signal. The fast analysis may include a fast comparison of the windings signal to one or more thresholds.

A given parameter of the windings signal 92 is of a first value when a column arc occurs. The given parameter of the windings signal 92 is of a second value when a supply unit arc occurs. The second value differs from the first value. The detection unit 30 may be configured to differentiate between the column arc and the supply unit arc based upon a value of the given parameter. According to an embodiment of the disclosure the given parameter is a polarity of the windings signal.

Transformer 40 and detection unit 30 may form arc detector 80.

Figure 2:
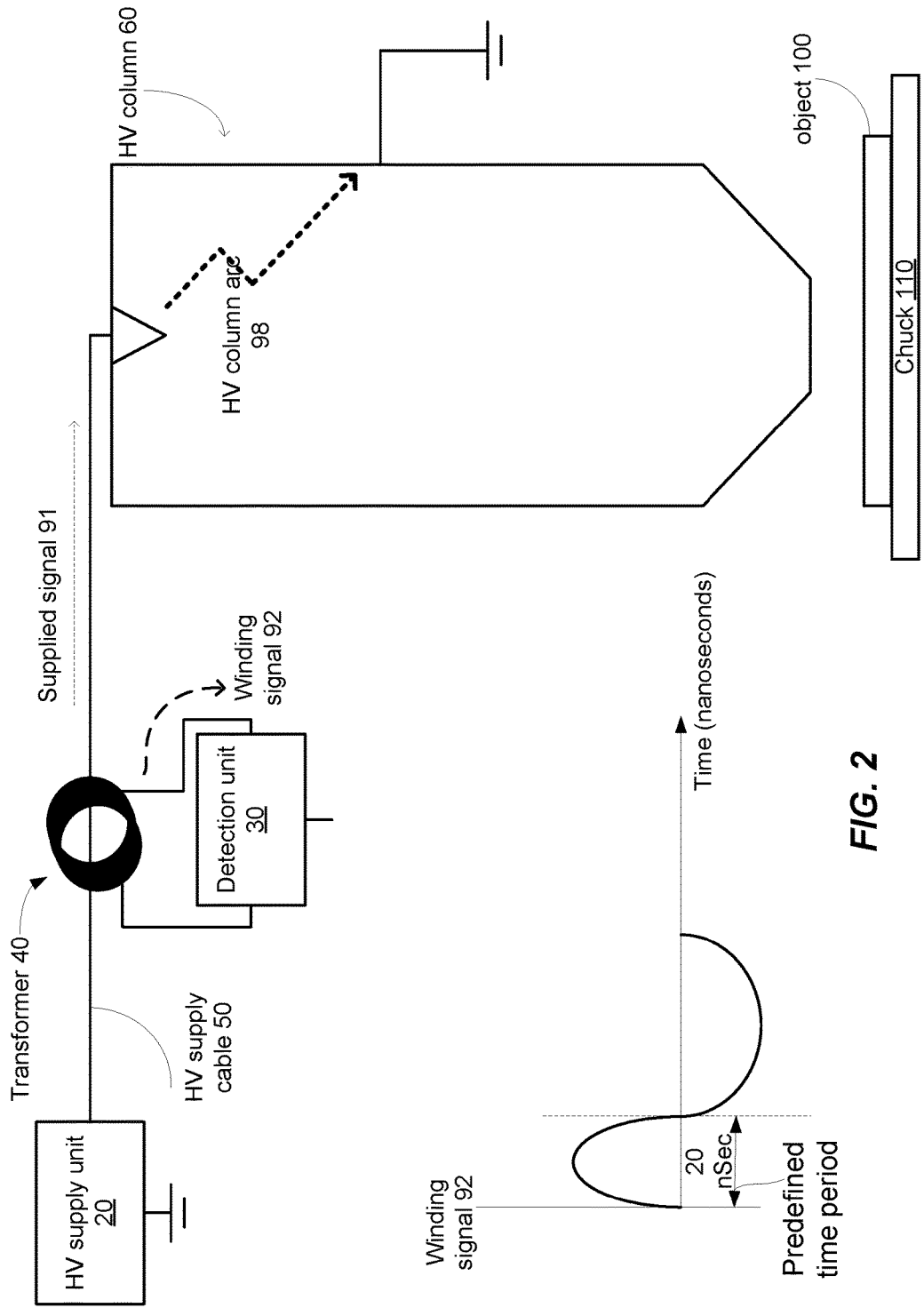
FIG. 2 illustrates a system and an object according to an embodiment of the disclosure.

Referring to FIG. 2, when a column arc 98 occurs—the HV supply cable 50 is virtually grounded via a ground of the HV column 60 and an undesired arc-induced current may flow within the HV supply cable 50 from the HV supply unit 20 to the HV column 60. This arc-induced current may cause the windings signal 92 to flow at a first direction—and be of positive polarity within a predefined period of about 20 nanoseconds—as illustrated in FIG. 2. The predefined period may differ from 20 nanoseconds.

Figure 3:
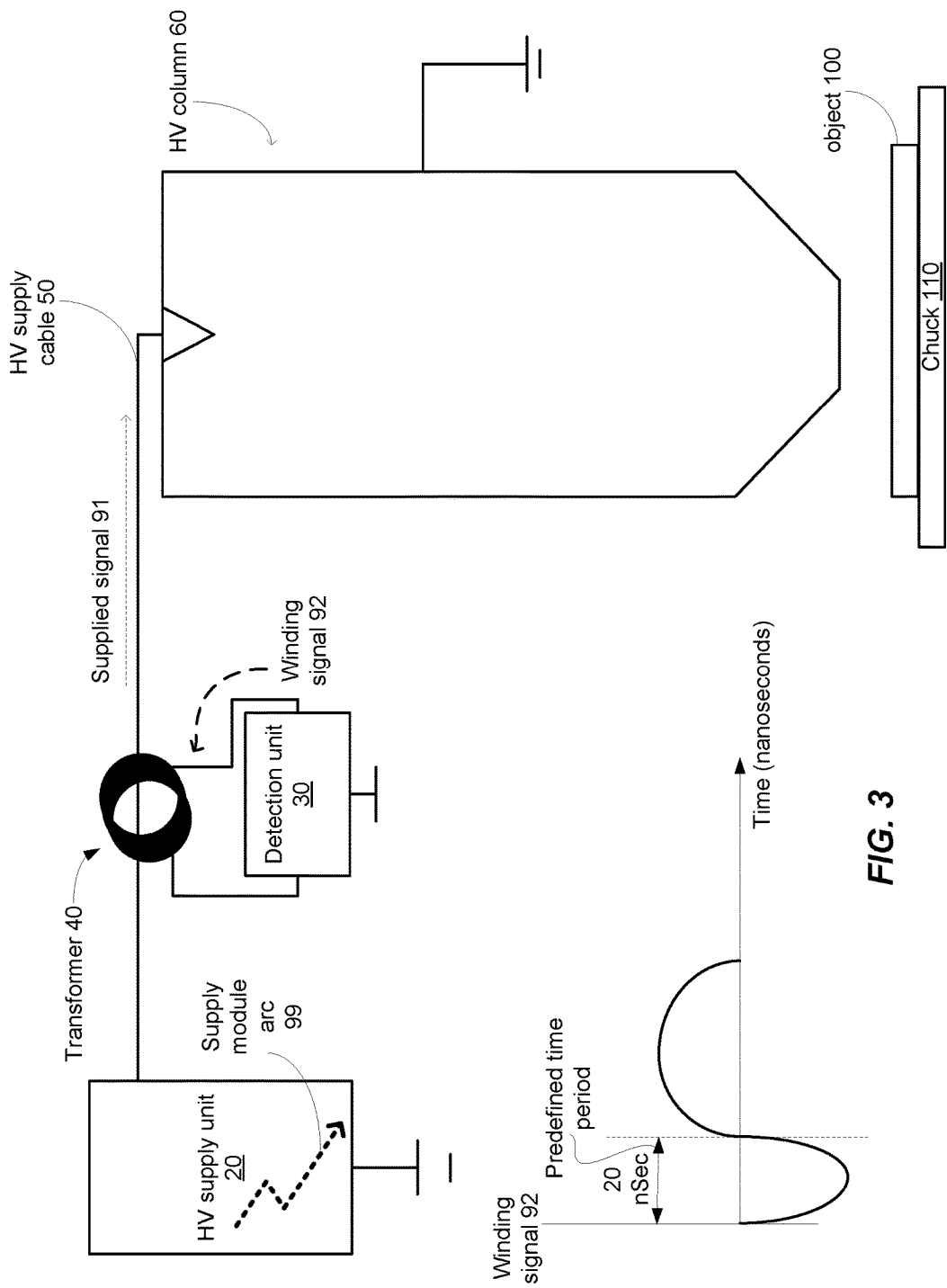
FIG. 3 illustrates a system and an object according to an embodiment of the disclosure.

Referring to FIG. 3, when a supply unit arc 99 occurs the HV supply cable 50 is grounded via a ground of the HV supply unit 20 and an undesired arc-induced current flows within the HV supply cable 50—from HV column 60 to the HV supply unit 20. This arc-induced current causes the windings signal 92 to flow at a second direction—and be of negative polarity within a predefined period of about 20 nanoseconds—as illustrated in FIG. 3. The predefined period may differ from 20 nanoseconds Referring to FIG. 4—the detection unit 30 may detect a column arc when the windings signal 92 is positive (within a predefined time period) and may detect a supply unit arc when the windings signal 92 is negative (within a predefined time period).

Figure 4:
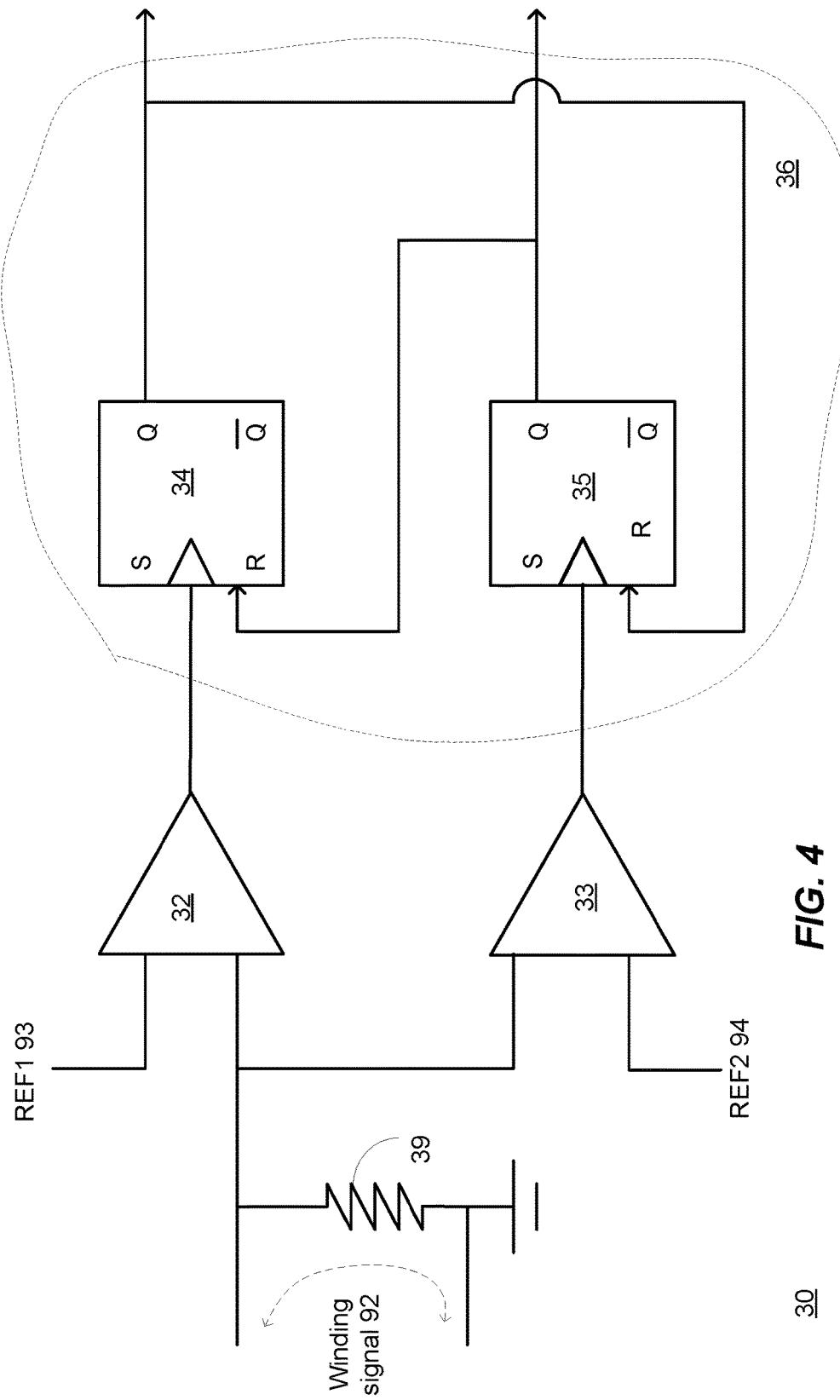
FIG. 4 illustrates a system and an object according to an embodiment of the disclosure.

FIG. 4 illustrates the detection unit 30 as including a first comparator 32, a first reference voltage REF1 93, a first SR flip-flop 34, a second comparator 33, a second reference voltage REF2 94, and second SR flip-flop 35. The first comparator 32 and the first reference voltage REF1 93 form a first detection circuit for detecting a column arc. When the windings signal 92 (represented by a voltage over resistor 39) exceeds REF1 93 then the first comparator 32 outputs a column arc detection signal towards first SR flip-flop 34.

The second comparator 33 and the second reference voltage REF2 94 form a second detection circuit for detecting a supply unit arc. When the windings signal 92 (represented by a voltage over resistor 39) is below REF2 94 then the second comparator 33 outputs a supply unit arc detection signal towards second SR flip-flop 35. REF1 93 may be a positive signal and REF2 94 may be a negative signal.

Because an initial arc may trigger secondary arcs it is beneficial to detect the initial arc. The suppression circuit 36 allows to detect the initial arc and to suppress detection signals indicative of secondary arc s. Suppression circuit 36 includes first SR flip-flop 34 and second SR flip-flop 35. The output port of second SR flip-flop 35 is coupled to the reset port of first SR flip-flop 34. The output port of first SR flip-flop 34 is coupled to the reset port of second SR flip-flop 35. Accordingly—the first flip flop to detect an arc resets the other flip flop and the detection unit outputs only one detection signal that is indicative of the initial arc.

Figure 5:
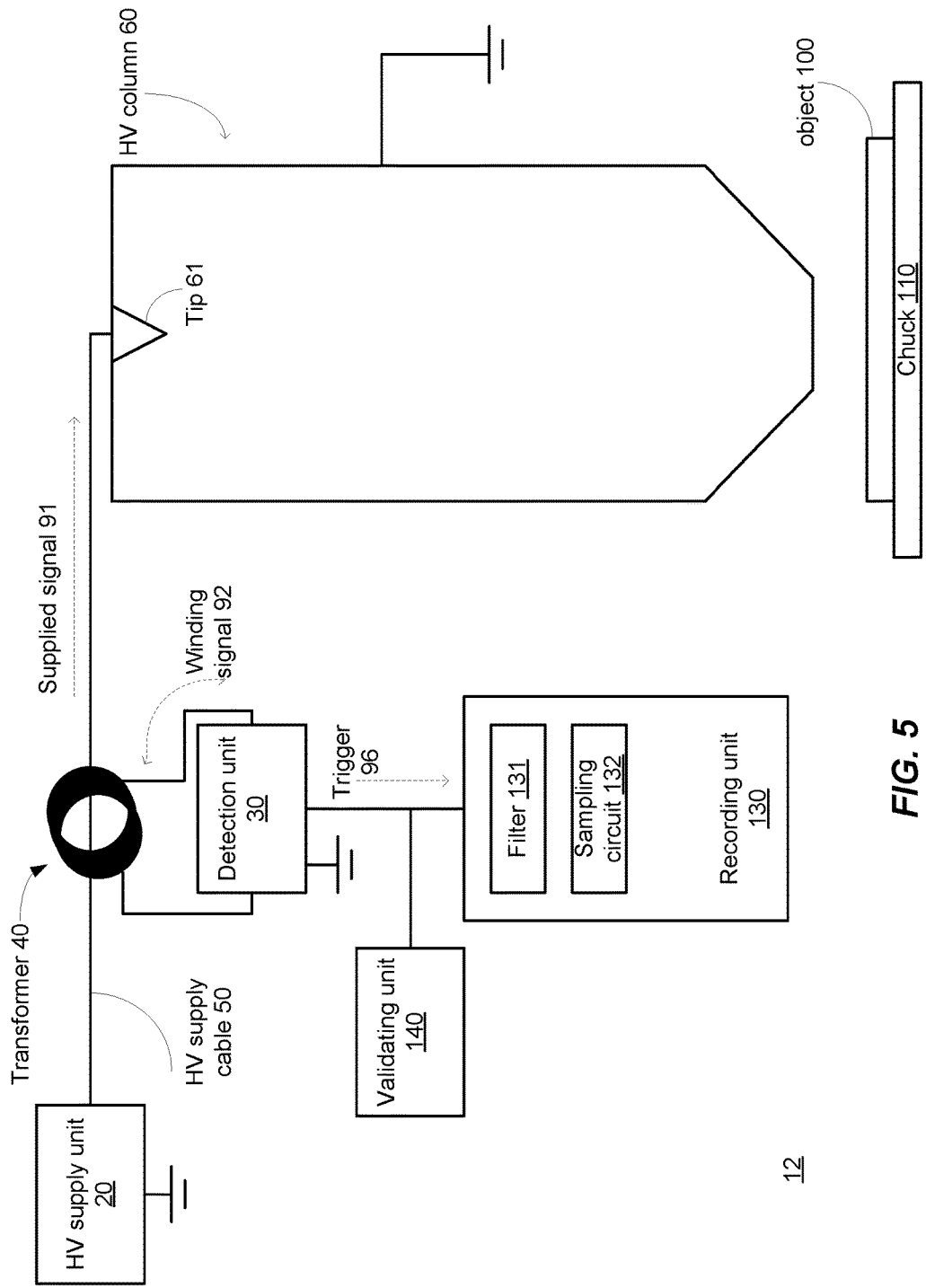
FIG. 5 illustrates a system and an object according to an embodiment of the disclosure.

FIG. 5 illustrates system 12 and object 100 according to an embodiment of the disclosure. System 12 includes HV supply unit 20, transformer 40, HV supply cable 50, HV column 60, detection unit 30 and chuck 110. System 12 also includes a validating unit 140 and a recording unit 130. The recording unit 130 includes a filter 131 and a sampling circuit 132.

The recoding unit 130 may record the windings signal for a given period after the detection of an arc by the detection unit 30. The given period may provide a tradeoff between memory consumption and the need to obtain enough information about the arc. The given period may be set to few (between two and twenty) microseconds. The recording of the windings signal may be triggered by trigger signal 96 sent from the detection unit 30 to the recording signal. Additionally or alternatively, the recording unit 130 may temporarily record the winding signals in a buffer and fetch from the buffer digital samples that correspond to the detection of an arc. The fetched digital samples may precede the detection of the arc. The fetched digital samples may be stored in another memory unit in order to enable an analysis of the fetched digital samples by the validating unit 140.

Filter 131 is configured to receive the windings signal 92 and to low pass filter the windings signal. The low pass filtering reduces noises and increases the signal to noise ratio. The filtered signal is sampled by sampling circuit 132. The sampling circuit 132 may include an analog to digital converter for sampling the filtered signal and a memory unit for storing digital samples of the filtered signal.

The digital samples may be used for various purposes including, for example, (a) validating, by the validating unit 140, that the detection unit 30 properly differentiated between a column arc and a supply source arc, and (b) determining whether the detection unit erroneously detected a noise as an arc.

The validating may include evaluating the parameter of the winding circuit that differentiates between column arc and a supply source arc. For example—the validating unit 140 may be configured to check the polarity of the windings signal at a predefined period—for example during the first twenty (till hundred) nanoseconds. The validating unit 140 may validate the detection by comparing the waveform of the windings signal to signatures of windings signals that are expected to appear as a result of an arc.

Figure 6:
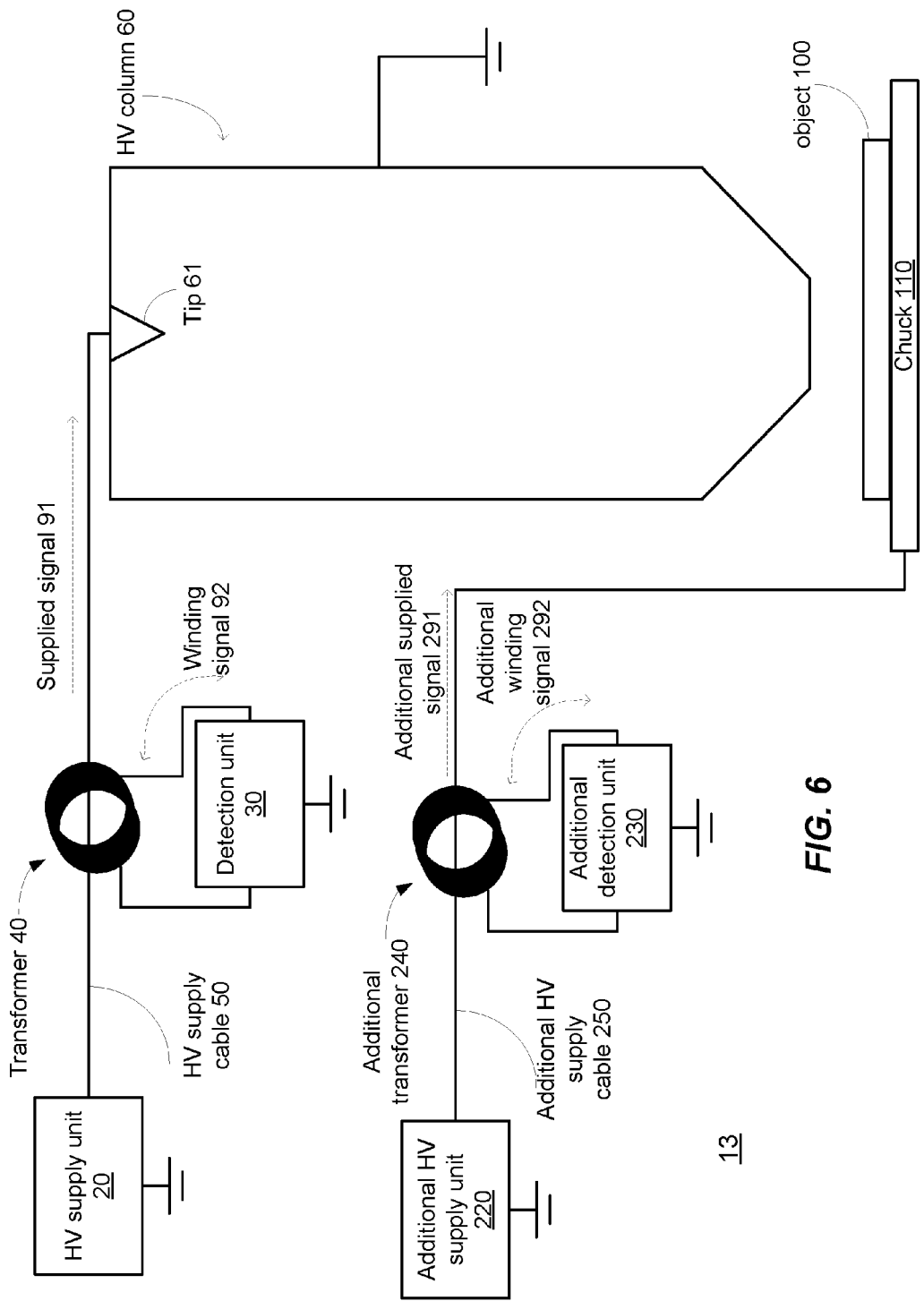
FIG. 6 illustrates a system and an object according to an embodiment of the disclosure.

FIG. 6 illustrates system 13 and object 100 according to an embodiment of the disclosure. System 13 includes HV supply unit 20, transformer 40, HV supply cable 50, HV column 60, detection unit 30 and chuck 110. System 13 also includes additional HV supply unit 220, additional transformer 240, additional HV supply cable 250 and additional detection unit 230. Additional HV supply unit 220 of system 13 feeds HV column 60 with an additional supplied signal 291 (such as HV supply voltage) via additional HV supply cable 250.

Additional transformer 240 of system 13 is configured to magnetically couple the additional supplied signal 291 to additional windings signal 292 developed within additional windings of the additional transformer. The additional windings are wound over an additional toroidal core of the additional transformer. The additional toroidal core surrounds the additional HV supply cable 250. The additional toroidal core may be of any shape (for example may have a rectangular cross section) and may or may not contact additional HV supply cable 250.

Additional detection unit 230 of system 13 is configured to monitor the additional windings signal 292 in order to detect a column arc formed within the HV column 60 and to detect a supply unit arc formed within the additional HV supply unit 220.

Figure 7:
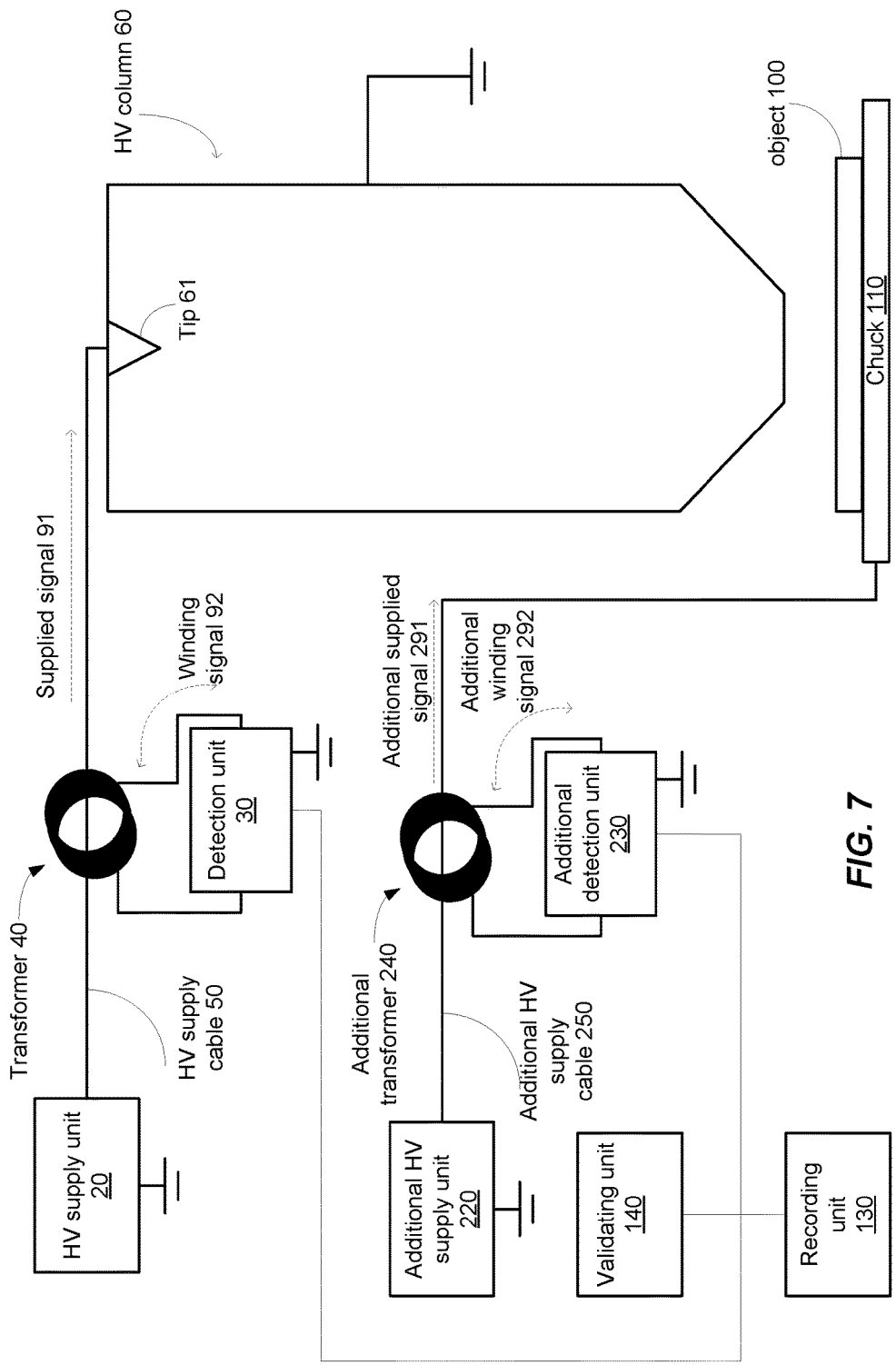
FIG. 7 illustrates a system and an object according to an embodiment of the disclosure.

FIG. 7 illustrates system 14 and object 100 according to an embodiment of the disclosure. System 14 includes HV supply unit 20, transformer 40, HV supply cable 50, HV column 60, detection unit 30, chuck 110, additional HV supply unit 220, additional transformer 240, additional HV supply cable 250 and additional detection unit 230. System 14 also includes validating unit 140 and a recording unit 130. Validating unit 140 and recording unit 130 are coupled to the detection unit 30 and the additional detection unit 230. It is noted that separate recording units and separate validating units may be allocated per each one of the detection unit and the additional detection unit.

Figure 8:
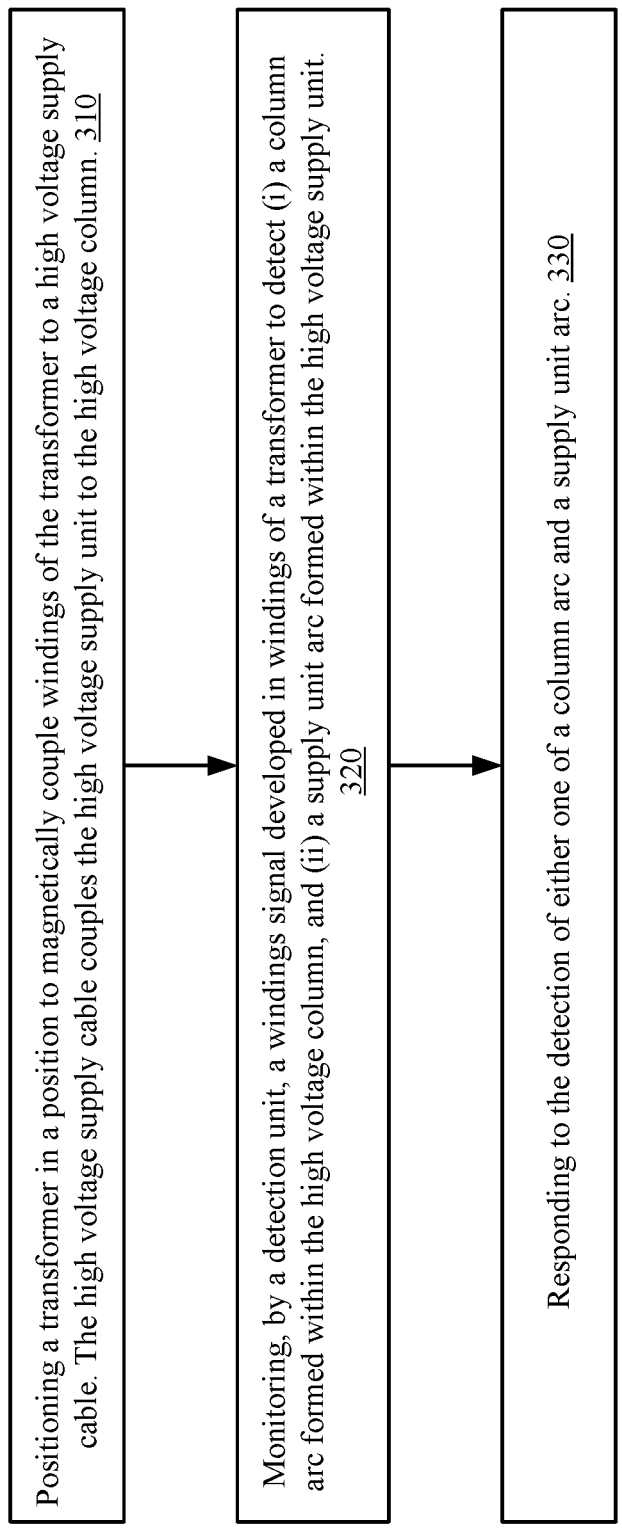
FIG. 8 illustrates a method according to an embodiment of the disclosure.

FIG. 8 illustrates method 300 according to an embodiment of the disclosure. Method 300 may start by step 310 of positioning a transformer in a position to magnetically couple windings of the transformer to a high voltage supply cable. The high voltage supply cable couples the high voltage supply unit to the high voltage column.

Step 310 may be followed by step 320 of monitoring, by a detection unit, a windings signal developed in windings of a transformer to detect (i) a column arc formed within the high voltage column, and (ii) a supply unit arc formed within the high voltage supply unit.

Step 320 may be followed by step 330 of responding to the detection of either one of a column arc and a supply unit arc. The responding may include validating the detection, sending an alert to a third party (such as a technician, a remote control center, and the like), recording the winding signal.

Although the previous figures referred to monitoring a column arc formed within a high voltage column and a voltage supply arc formed within a high voltage supply arc it is noted that the high voltage supply and the high voltage column are merely two non-limiting examples of high voltage units. A high voltage unit is a unit that is fed by one or more high voltage signals and additionally or alternatively, outputs one or more high voltage signals. The high voltage unit may be an electrical circuit, a radiation emitting circuit, a manufacturing unit, an inspection unit and the like.

Figure 9:
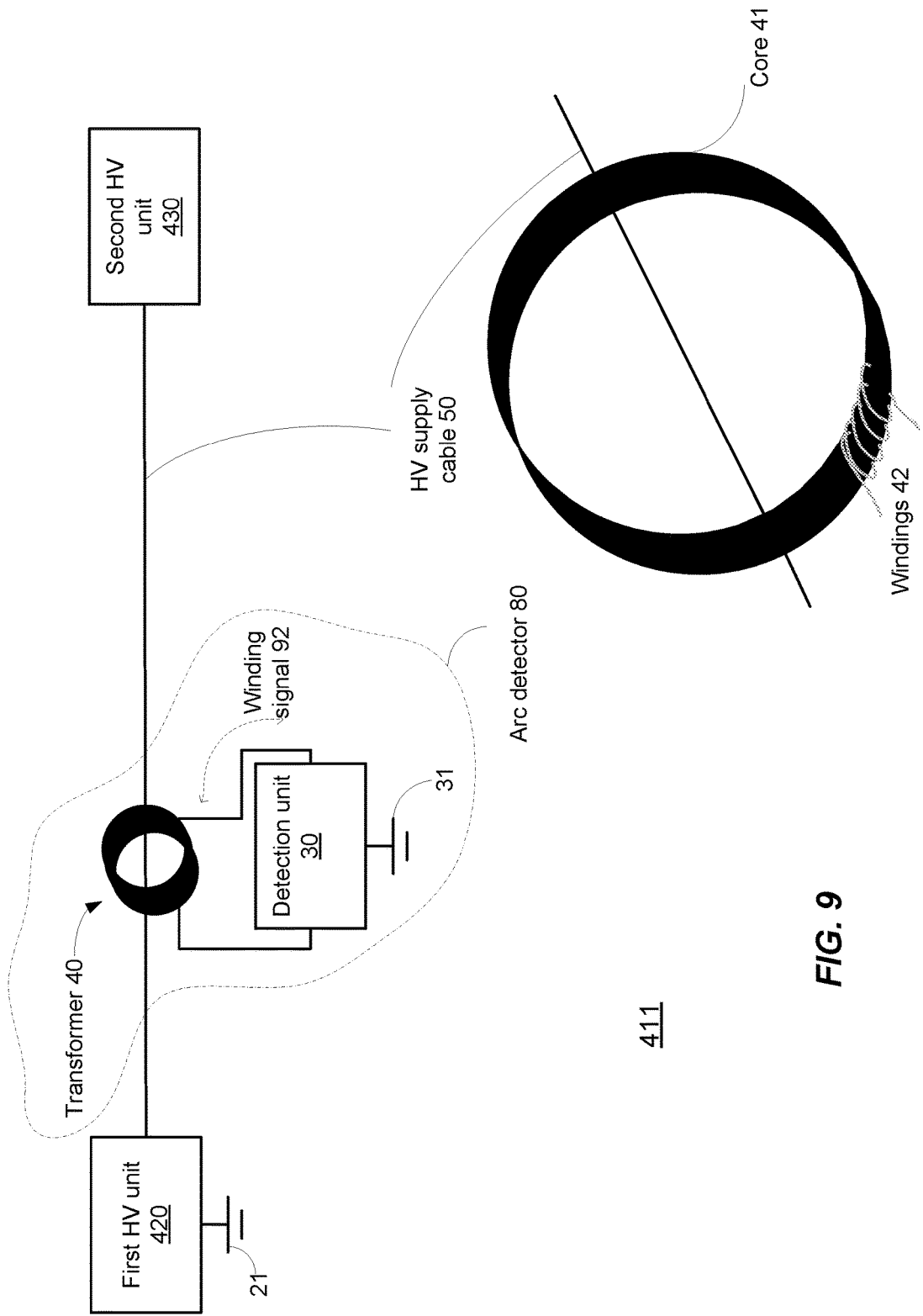
FIG. 9 illustrates a system according to an embodiment of the disclosure.

FIG. 9 illustrates system 411 that includes first high voltage unit 420, second high voltage unit 430, a high voltage (HV) supply cable 50 that couples between the first high voltage unit 420 and the second high voltage unit 430, a transformer 40 that is configured to magnetically couple the HV supply cable 50 to windings 42 of a transformer; and detection unit 30 that is configured to monitor a windings signal developed in the windings of the transformer to detect a first high voltage unit arc formed within the first high voltage unit and to detect a second high voltage unit arc formed within the second high voltage unit.

It should be noted that a high voltage unit may be an electrode, a circuit and the like. When multiple electrodes or circuits are coupled via multiple high voltage cables to other high voltage electrodes or circuits—the arc detectors coupled to the multiple high voltage cables may provide information about arc within each one of the electrodes or circuits that are coupled to the multiple cables.

In the foregoing specification, the disclosure has been described with reference to specific examples of embodiments of the disclosure. It will, however, be evident that various modifications and changes may be made therein without departing from the broader spirit and scope of the disclosure as set forth in the appended claims. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the structures depicted herein are merely exemplary, and that in fact many other structures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the disclosure.

We claim:

1. A system comprising: a first high voltage unit, a second high voltage unit, and a high voltage supply cable coupled between the first and second high voltage units; a transformer configured to magnetically couple the high voltage supply cable to windings of the transformer; and a detection unit configured to monitor a windings signal developed in the windings of the transformer to detect a first high voltage unit arc formed within the first high voltage unit and to detect a second high voltage unit arc formed within the second high voltage unit; wherein the second high voltage unit is a high voltage column that is configured to direct a charged particle beam towards an object; and wherein the detection unit is configured to monitor the windings signal developed in the windings of the transformer to detect a column arc formed within the column and to detect a supply unit arc formed within the high voltage supply unit.

2. The system according to claim 1 wherein a given parameter of the windings signal is of a first value when a column arc occurs; and wherein the given parameter of the windings signal is of a second value that differs from the first value when a supply unit arc occurs.

3. The system according to claim 2 wherein the detection unit is configured to differentiate between the column arc to the supply unit arc based upon a value of the given parameter.

4. The system according to claim 2 wherein the given parameter is a polarity of the windings signal.

5. The system according to claim 2 comprising a validation circuit for validating the detection of the column arc and for validating the detection of the supply unit arc.

6. The system according to claim 2 comprising a recording circuit for recording the windings signal.

7. The system according to claim 2 wherein the detection unit is grounded by a first grounding circuit; and wherein the supply unit is grounded by a second grounding circuit that differs from the first grounding circuit.

8. The system according to claim 2 wherein the detection unit comprises a first detection circuit for detecting a column arc and a second detection circuit for detecting a supply unit arc.

9. The system according to claim 8 further comprising a suppression circuit for: (a) preventing the second detection circuit from detecting the supply unit arc as a response of a detection of the column arc, and (b) preventing the first detection circuit from detecting the column arc as a response of a detection of the supply unit arc.

10. An inspection system comprising:
a substrate support;
a high voltage supply cable;
a high voltage column coupled to the high voltage supply cable and configured to direct a charged particle beam towards an object positioned on the substrate support in response to a high voltage signal;
a high voltage supply unit coupled to the high voltage supply cable and configured to feed the high voltage signal to the high voltage column over the high voltage supply cable; and
an arc detector comprising:
a transformer including a plurality of windings and operatively coupled around the high voltage supply cable to magnetically couple the high voltage supply cable to the plurality of windings; and a detection unit configured to monitor a windings signal developed in the windings of the transformer to detect a column arc formed within the high voltage supply unit and to detect a supply unit arc formed within the high voltage supply unit.

11. The inspection system of claim 10 wherein the high voltage column includes a tip for generating the charged particle beam.

12. The inspection system of claim 10 wherein the detection unit comprises shielding that reduces electromagnetic interference from the transformer.

13. The inspection system of claim 10 wherein the detection unit is grounded via a first grounding circuit and the high voltage supply unit is grounded by a second grounding circuit separate from the first grounding circuit.

14. A method of detecting an occurrence of an arc in an inspection system, the method comprising: generating, with a high voltage column, a charged particle beam for an inspection process by: (i) generating a high voltage supply signal and (ii) feeding the high voltage supply signal over a high voltage line to the high voltage column; magnetically coupling a plurality of windings in a transformer to the high voltage line; monitoring, by a detection unit, a windings signal developed in the plurality of windings of the transformer to detect a first high voltage unit arc formed within the first high voltage unit and to detect a second high voltage unit arc formed within the second high voltage unit, and to detect a column arc formed within a column and to detect a supply unit arc formed within the high voltage supply unit.

* * * * *